United States Patent [19]
Fulford, Jr. et al.

[11] Patent Number: 6,008,109
[45] Date of Patent: Dec. 28, 1999

[54] TRENCH ISOLATION STRUCTURE HAVING A LOW K DIELECTRIC ENCAPSULATED BY OXIDE

[75] Inventors: H. Jim Fulford, Jr., Austin; Mark I. Gardner, Cedar Creek; Charles E. May, Austin, all of Tex.

[73] Assignee: Advanced Micro Devices, Inc., Sunnyvale, Calif.

[21] Appl. No.: 08/995,121

[22] Filed: Dec. 19, 1997

[51] Int. Cl.$^6$ ................................................. H01L 21/76
[52] U.S. Cl. ........................... 438/437; 438/692; 438/702
[58] Field of Search ................................... 438/424, 427, 438/435, 437, 700, 691, 702, 692; 257/510

[56] References Cited

U.S. PATENT DOCUMENTS

| | | | |
|---|---|---|---|
| 5,447,884 | 9/1995 | Fahey et al. | 438/437 |
| 5,726,090 | 3/1998 | Jang et al. | 438/435 |
| 5,753,562 | 5/1998 | Kim | 438/424 |
| 5,888,880 | 3/1999 | Gardner et al. | 438/424 |
| 5,909,628 | 6/1999 | Chatterjee et al. | 438/424 |

*Primary Examiner*—Carl Whitehead, Jr.
*Assistant Examiner*—Kurt Eaton
*Attorney, Agent, or Firm*—Kevin L. Daffer; Conley, Rose & Tayon

[57] ABSTRACT

A process is provided for forming a trench isolation structure which includes a dielectric material having a relatively low dielectric constant, K, that is approximately less than 3.8. The capacitance between active areas separated by the trench isolation structure, being directly proportional to K, is thus reduced. As a result, the lateral width of the isolation structure may be decreased without significantly increasing the capacitance between those active areas. In an embodiment, a trench is etched within a semiconductor substrate upon which a masking layer is formed. An oxide liner is thermally grown upon the sidewalls and base of the trench. A low K dielectric material is formed within the trench such that its upper surface is level with the upper surface of the substrate. A fill oxide is then formed across the upper surface of the dielectric material. The resulting trench isolation structure includes a low K dielectric material encapsulated by some form of oxide. The trench isolation structure is less likely to experience current leakage during the operation of an ensuing integrated circuit employing the isolation structure.

7 Claims, 5 Drawing Sheets

FIG. 11b

TRENCH ISOLATION STRUCTURE HAVING A LOW K DIELECTRIC ENCAPSULATED BY OXIDE

BACKGROUND OF THE INVENTION

1. Field of the Invention

This invention relates to integrated circuit fabrication and, more particularly, to a trench isolation structure arranged within a silicon-based substrate, wherein the isolation structure includes an encapsulated dielectric material having a relatively low dielectric constant to enhance the reliability of the integrated circuit employing the isolation structure.

2. Description of the Relevant Art

The fabrication of an integrated circuit involves forming numerous devices in active areas of a semiconductor substrate. Select devices are interconnected by conductors which extend over a dielectric that separates or "isolates" those devices. Implementing an electrical path across a monolithic integrated circuit involves selectively connecting devices which are isolated from each other. When fabricating integrated circuits, it is therefore necessary to isolate devices built into the substrate from one another. From this perspective, isolation technology is one of the critical aspects of fabricating a functional integrated circuit.

A popular isolation technology used for a MOS integrated circuit is a technique known as the "shallow trench process". Conventional trench processes involve the steps of etching a silicon-based substrate surface to a relatively shallow depth, e.g., between 0.2 to 0.5 microns, and then refilling the shallow trench with a deposited dielectric. The trench dielectric is then planarized to complete formation of a trench isolation structure in field regions of the substrate. The trench isolation structure is formed during the initial stages of integrated circuit fabrication, before source and drain implants are placed in device areas or active areas. Trench isolation processing serves to prevent the establishment of parasitic channels in the field regions between active areas. The trench process is becoming more popular than the local oxidation of silicon ("LOCOS") process, another well known isolation technique. The shallow trench process eliminates many of the problems associated with LOCOS, such as bird's-beak and channel-stop dopant redistribution problems. In addition, the trench isolation structure is fully recessed, offering at least a potential for a planar surface. Yet further, field-oxide thinning in narrow isolation spaces is less likely to occur when using the shallow trench process.

While the conventional trench isolation process has many advantages over LOCOS, the trench process also has several problems. Because of an increased desire to build faster and more complex integrated circuits, the semiconductor industry has devoted much effort to reducing the feature sizes of and the separation between active devices arranged within a semiconductor substrate. Consequently, the lateral width of the trench isolation structure has grown increasingly smaller. To ensure that a trench isolation structure can effectively isolate active devices, the capacitance between those active devices must be minimized. The value of this capacitance is dependent upon the lateral width of the isolation structure and the relative permittivity of the trench dielectric, which is typically silicon dioxide ("oxide"). Permittivity, $\in$, of a material reflects the ability of the material to be polarized by an electric field. The capacitance between two active areas separated by a dielectric is directly proportional to the permittivity of the dielectric. The permittivity of a material is typically described as its permittivity normalized to the permittivity of a vacuum, $\in_o$. Hence, the relative permittivity or dielectric constant of a material is defined as:

$$K = \in/\in_o$$

The capacitance between active areas laterally spaced apart by a dielectric increases as the lateral width of the dielectric decreases. Unfortunately, the dielectric constant, K, of oxide is not sufficiently low (i.e., K is approximately 3.7 to 3.8) to counterbalance the effect that reducing the lateral width of the isolation structure has on the capacitance between active areas. As such, breakdown of the trench oxide may occur in response to current flowing in an active device adjacent the trench oxide. As a result, current may inadvertently flow between active devices separated by a narrowed trench isolation structure. In particular, current leakage between a source/drain region of one transistor and a source/drain region of another transistor may occur. In this manner, a transistor may receive a false signal, resulting in improper operation or failure of an integrated circuit employing the trench isolation structure.

It would therefore be desirable to develop a technique for forming a trench isolation structure which would be less likely to experience breakdown during operation of an integrated circuit employing the isolation structure. It would be beneficial if the dimensions of the trench isolation structure could be reduced without being concerned with current leakage between active areas isolated by the isolation structure. Increased capacitance between active areas separated by the isolation structure could thus be prevented, despite reductions in the lateral width of the isolation structure. It would be possible to accomplish an increased integration density and reduced propagation delay of active devices employed by an integrated circuit without sacrificing operability of the integrated circuit.

SUMMARY OF THE INVENTION

The problems outlined above are in large part solved by the technique hereof for fabricating a trench isolation structure which includes a dielectric material having a relatively low dielectric constant, K. That is, the dielectric constant of the dielectric material is approximately less than that of oxide (K=3.8). The capacitance between active areas separated by the trench isolation structure, being directly proportional to K, is thus reduced. As a result, the lateral width of the isolation structure may be decreased without significantly increasing the capacitance between those active areas. Therefore, the probability that the trench isolation structure will breakdown is significantly reduced. The size of the trench isolation structure thus can be minimized to permit increased circuit integration density while maintaining sufficient isolation of the active areas. In this manner, problems such as current (and thus a false signal) undesirably passing from a source/drain region of one transistor to a source/drain region of another transistor via the isolation structure are less likely to be encountered.

In one embodiment of the present invention, a masking layer comprising a nitride layer arranged upon a relatively thin oxide layer is formed across a semiconductor substrate. Select portions of the masking layer and underlying substrate not covered by a protective photoresist layer may then be removed to form a relatively shallow trench within the substrate. The masking layer remains disposed upon the upper surface of the substrate exclusive of the trench. An oxide layer may then be thermally grown within the trench upon the exposed edges of the substrate, thereby forming an oxide liner at the periphery of the trench. The masking layer prevents oxidation of the underlying upper surface of the substrate. Thereafter, a dielectric material having a relatively low K value of less than about 3.8 may be deposited using chemical vapor deposition ("CVD") into the trench and across the masking layer. An etchback step may then be used to remove the dielectric material down to a level approximately equivalent to the upper surface of the substrate. Thereafter, fill oxide may be deposited across the resulting planar surface of the low K dielectric material to a level spaced above the masking layer. A chemical-mechanical polishing ("CMP") step may be used to planarize the upper surface of the oxide layer. The CMP step may be performed for the time period required to remove portions of the fill oxide and the masking layer down to a level spaced above the semiconductor substrate. The masking layer is then etched away to expose the silicon-based substrate. The resulting trench isolation structure comprises a low K dielectric material bounded within shallow trench areas and encapsulated on all sides by oxide.

Another embodiment of the invention contemplates depositing a thin layer of low K dielectric material across the oxide liner and the masking layer. Thus, the dielectric material does not fill a substantial portion of the trench arranged in the substrate, as in the previous embodiment. No etchback step of the dielectric material is required to make the upper surface of the material approximately level with that of the substrate. The fill oxide is deposited upon the layer of dielectric material into the trench to a level above a portion of the dielectric material arranged upon the surface of the masking layer. As a result, the trench is completely filled with material. CMP is then used to planarize the surface of the fill oxide and to remove portions of the masking layer, the fill oxide, and the layer of dielectric material down to a level spaced above the upper surface of the substrate. The trench isolation structure includes a layer of dielectric material interposed between a fill oxide and an oxide liner. The dielectric material is bounded on the sides and the bottom by some form of oxide. Because the layer of low K dielectric material within the trench of this embodiment occupies less space than the low K dielectric material of the previous embodiment, the previous embodiment appears to have certain performance advantages. Since the trench isolation structure of the first embodiment includes more low K dielectric material than the isolation structure of the second embodiment, it provides the best protection against breakdown. Hence, an integrated circuit employing the trench isolation structure of the first embodiment would be less likely to experience inoperability.

The low K dielectric material of both embodiments is isolated from the silicon-based substrate by an oxide liner. The oxide liner serves as a diffusion barrier against cross-diffusion of atoms within the dielectric material and species within the substrate. The low K dielectric material may include various fluorine-based compounds and polymers. Species within the dielectric material, such as fluorine(F), carbon (C), and hydrogen (H) atoms may have detrimental effects on the active areas of the semiconductor substrate. Accordingly, preventing the diffusion of species from the trench isolation structure to the active areas is necessary to ensure proper operation of the ensuing integrated circuit. Absent the presence of the oxide liner between the dielectric material and the substrate, the F, C, and H atoms would be able to migrate into adjacent active areas. Since trench formation involves etching of the silicon substrate, it is believed that dangling bonds and an irregular grain structure exist in the silicon substrate near the walls of the trench. Therefore, during a subsequent anneal step, the irregular grain structure would provide migration avenues through which atoms could pass into the active areas. The dangling bonds would provide opportune bonds sites for the F, C, and H atoms, and Si—F, Si—C, and Si—H bonds might form within the active areas, particularly in close proximity to the trench walls. Thus, in later processing steps, less segregation sites would be available to impurity species implanted within the active areas. As a result, the resistivity of ensuing source/drain regions formed within the active areas of the substrate might be increased from design specification, particularly near the edges of the isolation trench. The lateral edges of the ensuing transistors which would employ those source/drain regions might conduct less current than the interior portion of the transistors. Therefore, more charge to the gate of each transistor would be required to invert its channel, resulting in an undesirable shift of the transistor threshold voltage, $V_T$, from its design specification.

In addition to preventing species within the low K dielectric material from migrating into the active areas, it is also necessary to inhibit the diffusion of impurity species from the substrate into the dielectric material. Typically, a channel-stop implant is forwarded into regions of the substrate arranged directly underneath the isolation trench prior to forming material within the trench. A $p^+$ implant of boron may, e.g., be used. Without the presence of the oxide liner between the substrate and the low K dielectric material, it would be possible for the implanted impurity species to pass through migration avenues at the trench walls into the dielectric material. For example, boron atoms might diffuse into the dielectric material and bond with fluorine atoms to form a highly stable compound, e.g., boron difluoride. As a result, less boron atoms would be available in the substrate to prevent flow of current underneath the trench isolation structure. Further, the boron atoms within the dielectric material and their associated compounds might cause the resistivity of the dielectric material to decrease. In addition to the channel-stop dopants, the dopants implanted into the active areas in later processing steps might also pass into and become arranged within the dielectric material when subjected to high temperature anneals. The presence of contaminants within the dielectric material would promote the flow of parasitic current through the trench isolation structure during operation of an ensuing integrated circuit employing the isolation structure.

Advantageously, the oxide liner arranged between the low K dielectric material and the silicon-based substrate helps inhibit cross-diffuision of atoms between those regions. The oxide liner, being a high quality thermally grown oxide, contains stoichiometric $SiO_2$ bonds. While foreign atoms may be able to migrate into the oxide liner, very few of the foreign atoms pass entirely through the oxide liner. In addition, the fill oxide may be strategically placed above the dielectric material of low K value to advantageously inhibit atoms within the dielectric material from passing into an overlying interlevel dielectric which has a high propensity for accepting such foreign atoms. Absent the fill oxide, foreign atoms could migrate into and become positioned within a low density interlevel dielectric, e.g., spin-on-glass (SOG). It is believed that silicon and oxygen atoms within the oxide liner and the fill oxide block the pathways of the foreign atoms, preventing the deleterious diffusion of those atoms into other regions of the semiconductor topography. Further, the foreign atoms may become entrapped within the oxide liner and the fill oxide at opportune bond sites where they form bonds with, e.g., available Si atoms. In this manner, the oxide liner and fill oxide function as good diffusion barriers against migration of species from the dielectric material of the isolation structure to adjacent regions, and vice versa.

BRIEF DESCRIPTION OF THE DRAWINGS

Other objects and advantages of the invention will become apparent upon reading the following detailed description and upon reference to the accompanying drawings in which:

FIG. 7a is a partial cross-sectional view of the semiconductor topography, wherein the dielectric material is etched down to a level approximately commensurate with an upper surface of the semiconductor substrate, subsequent to the step in FIG. 6a;

FIG. 8a is a partial cross-sectional view of the semiconductor topography, wherein a fill oxide is deposited across the dielectric material to a level spaced above the masking layer, subsequent to the step in FIG. 7a;

FIG. 9a is a partial cross-sectional view of the semiconductor topography, wherein portions of the fill oxide, the dielectric material, and the nitride layer are removed down to a level spaced above the upper surface of the substrate using CMP, subsequent to the step in FIG. 8a;

FIG. 10 is a partial cross-sectional view of the semiconductor topography, wherein the oxide layer and the nitride layer are etched from above the semiconductor substrate to form a trench isolation structure, subsequent to the step in FIG. 9a;

DETAILED DESCRIPTION OF THE INVENTION

Figure 1:
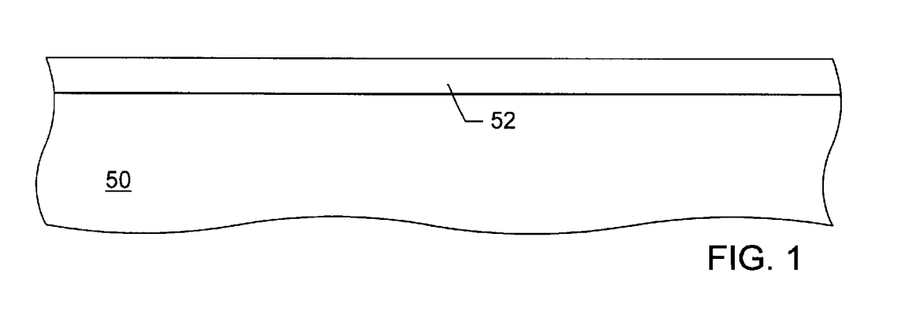
FIG. 1 is a partial cross-sectional view of a semiconductor topography, wherein an oxide layer is formed across a semiconductor substrate, according to an embodiment of the present invention.
Figure 2:
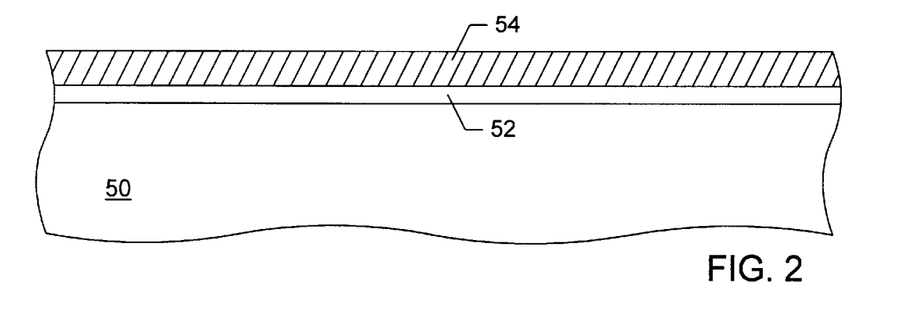
FIG. 2 is a partial cross-sectional view of the semiconductor topography, wherein a silicon nitride layer is deposited across the oxide layer, subsequent to the step in FIG. 1.
Figure 3:
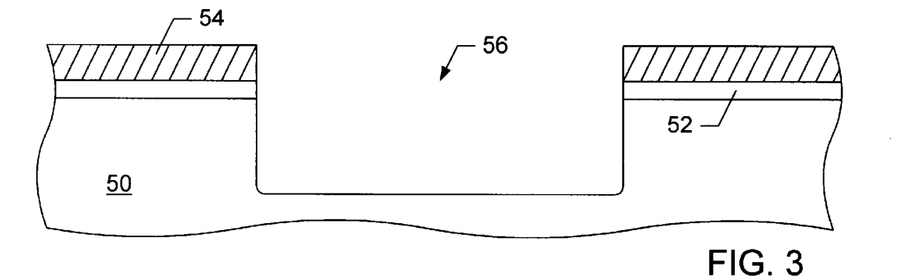
FIG. 3 is a partial cross-sectional view of the semiconductor topography, wherein portions of the silicon nitride layer, the oxide layer, and the substrate are removed to define a trench within the semiconductor substrate, subsequent to the step in FIG. 2.

Turning now to FIG. 1, a partial cross-sectional view of a semiconductor substrate 50 is depicted. Substrate 50 comprises single crystalline silicon slightly doped with n-type or p-type impurities. An oxide layer 52 is formed across semiconductor substrate 50. Oxide layer 52 may either be thermally grown or CVD deposited from, e.g., a silane and oxygen bearing gas upon substrate 50. As shown in FIG. 2, a silicon nitride ("nitride") layer 54 may be deposited across oxide layer 52. The nitride deposition may be performed using, e.g., a horizontal tube LPCVD reactor provided with a silane- and ammonia- containing gas. Oxide layer 52 serves as a "pad oxide" between nitride layer 54 and oxide layer 52 by reducing the inherent stresses that exist between CVD nitride and silicon. FIG. 3 depicts portions of nitride layer 54, oxide layer 52, and substrate 50 being etched down to a level spaced below the upper surface of the substrate. A photoresist layer may be patterned above select portions of masking layer 54 prior to the etch step using a well known optical lithography technique. Those portions of nitride layer 54, oxide layer 52, and substrate 50 not covered by the photoresist layer may be etched for a pre-determined period of time using, e.g., a dry, plasma etch technique. In this manner, a relatively shallow trench 56 having a depth of approximately 0.2 to 1.0 microns is formed within a field region of semiconductor substrate 50.

Figure 4:
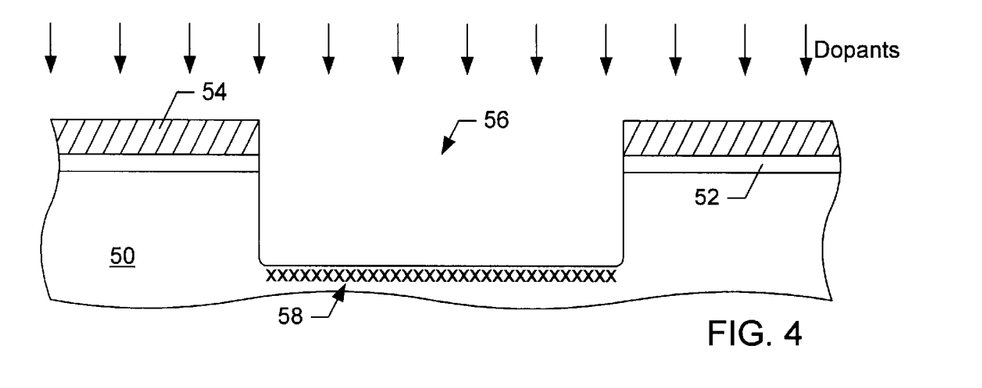
FIG. 4 is a partial cross-sectional view of the semiconductor topography, wherein a channel-stop implant is forwarded into a region of the substrate underlying the trench, subsequent to the step in FIG. 3.
Figure 5:
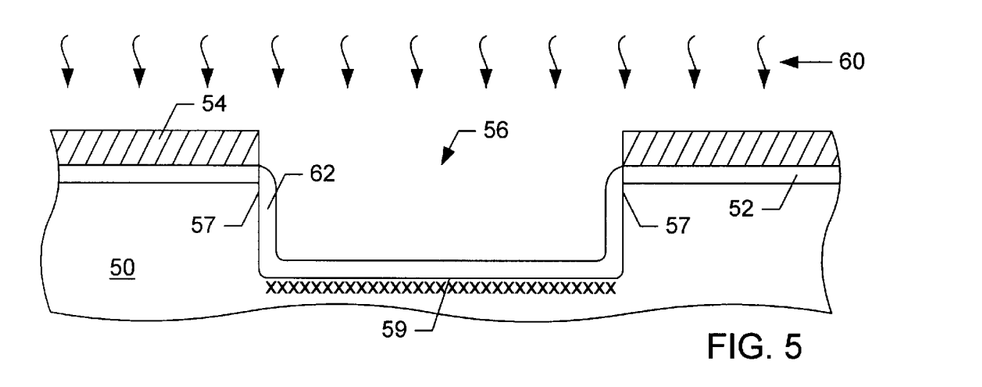
FIG. 5 is a partial cross-sectional view of the semiconductor topography, wherein an oxide liner is thermally grown upon exposed surfaces of the substrate at the periphery of the trench, subsequent to the step in FIG. 4.

FIG. 4 depicts dopants being implanted into a region 58 of substrate 50 directly below trench 56. The nitride layer 54/oxide layer 52 masking structure prevent impurity species from entering other regions of substrate 50. As such, only the trench 62 which remains exposed between opposed sidewall surfaces of the nitride layer 54/oxide layer 52 structure, receives the blanket implant. The implant is performed to create a channel-stop dopant layer underneath the ensuing trench isolation structure. The type of dopants chosen for the channel-stop implant is opposite to that used during a later implant into active areas (mesa regions) of substrate 50 which are laterally separated by trench 56. A $p^+$ implant of boron or an $n^+$ implant of arsenic, e.g., may be used. As shown in FIG. 5, the semiconductor topography is then exposed to a form of radiation 60 in the presence of ambient oxygen or steam, resulting in the oxidation of exposed silicon within substrate 50. Radiation 60 may be thermal radiation provided from a heated furnace. Alternately, radiation 60 may be radiant light supplied from e.g., an arc lamp or a tungsten-halogen lamp using a technique known as rapid thermal processing ("RTP"). RTP allows the semiconductor topography to be heated to a relatively high temperature for a short period of time, and thus reduces or prevents unwanted diffusion of the channel-stop dopants. A thermally grown oxide liner 62 is thusly formed at the periphery of trench 56 upon the sidewalls 57 and base 59 of the trench. Nitride layer 54 serves to prevent the ambient steam or oxygen from reaching those surfaces of substrate 50 arranged underneath oxide layer 52. Therefore, oxidation of the upper surface of substrate 50 is prevented by the presence of nitride layer 54.

Figure 6A:
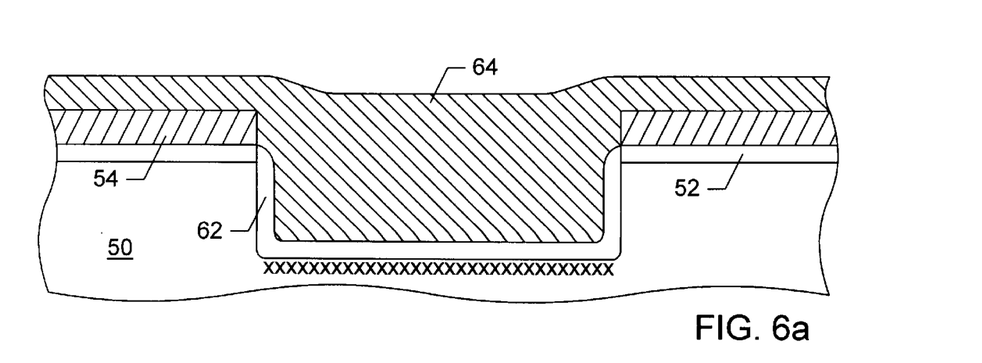
FIG. 6a is a partial cross-sectional view of the semiconductor topography according to one embodiment, wherein a dielectric material is deposited into the trench to a level spaced above the silicon nitride layer, subsequent to the step in FIG. 5.
Figure 6B:
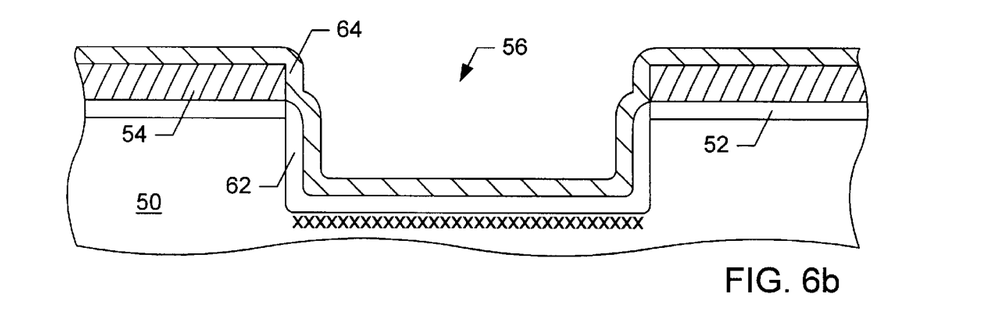
FIG. 6b is a partial cross-sectional view of the semiconductor topography according to another embodiment, wherein a layer of dielectric material is deposited across exposed surfaces of the topography, subsequent to the step in FIG. 5.

Subsequent steps may be performed according to an embodiment illustrated in FIGS. 6a, 7a, 8a, 9a, and 10 or an alternate embodiment depicted in FIGS. 6b, 7b, 8b, and 9b. FIG. 6a depicts the deposition of a dielectric material 64 across exposed surfaces of the semiconductor topography to a level spaced above nitride layer 54. Dielectric material 64 has a dielectric constant, K, that is less than approximately 3.8. The low K dielectric material 64 may be CVD deposited (LPCVD or PECVD) or spin-on deposited across the topological surface. The relatively low K dielectric material 64 may comprise, but is not limited to, the following materials: fluorosilicate glass (FSG), silicon oxyfluoride, hydrogen silsesquioxane, fluorinated polysilicon, polyphenylquinoxaline, polyqunoline, methysilsesquioxane polymer, and fluoro-polymide. Those materials listed above which contain fluorine typically have a K value ranging from approximately 3.0 to 3.8. The polymer-based materials listed above typically have a K value ranging from approximately 2.0 to 3.5. FIG. 6b depicts an alternative to the step shown in FIG. 6a. A layer of dielectric material 64 is deposited across the exposed surfaces of the semiconductor topography. In contrast to FIG. 6a, dielectric material 64 in FIG. 6b does not fill trench 56 or the space arranged between opposed sidewall surfaces of nitride layer 54.

Figure 7A:
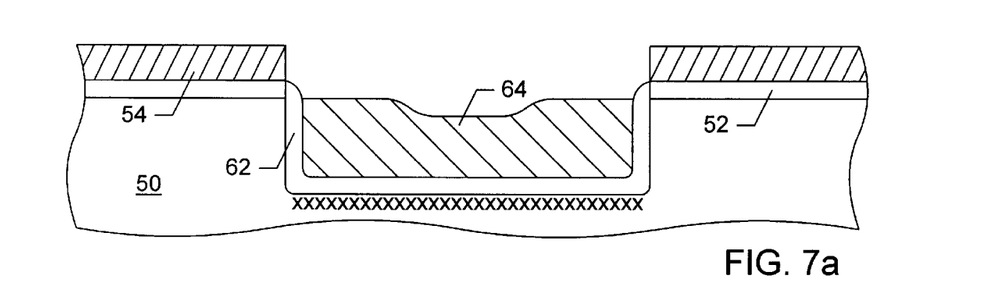

FIG. 7a depicts a processing step to be performed after the step shown in FIG. 6a. An etchback technique is performed to remove the upper surface of dielectric material 64 down to a level approximately commensurate with the upper surface of substrate 50. The etchback technique may involve a blanket etch of dielectric material 64 down to nitride layer 54, followed by a selective etch of dielectric material 64 arranged between opposed sidewall surfaces of nitride layer 54. The blanket etch may involve using a dry, plasma etch in which the etch duration is chosen to terminate before substantial portions of nitride layer 54 are removed. The selective etch may involve using optical lithography to define the region of the topography to be etched, followed by an anisotropic etch which occurs at a faster rate in a vertical direction than in a horizontal direction. Since ion ablation occurs more frequently upon horizontally oriented surfaces than vertically oriented surfaces, portions of masking layer 54 covered by a photoresist layer are not substantially attacked.

Figure 7B:
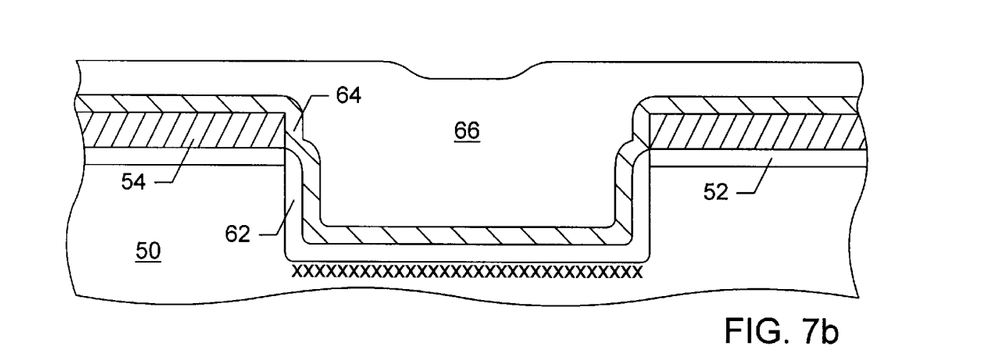
FIG. 7b is a partial cross-sectional view of the semiconductor topography, wherein a fill oxide is deposited across the layer of dielectric material to a level spaced above the masking layer, subsequent to the step in FIG. 6b.
Figure 8A:
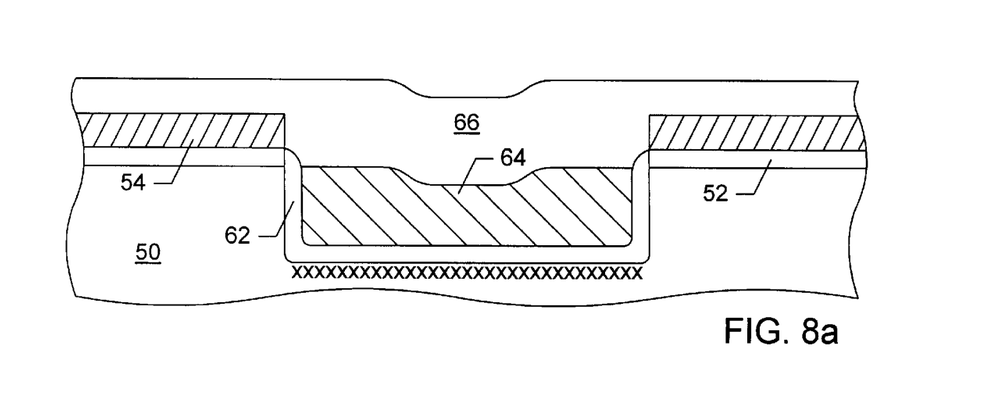
Figure 8B:
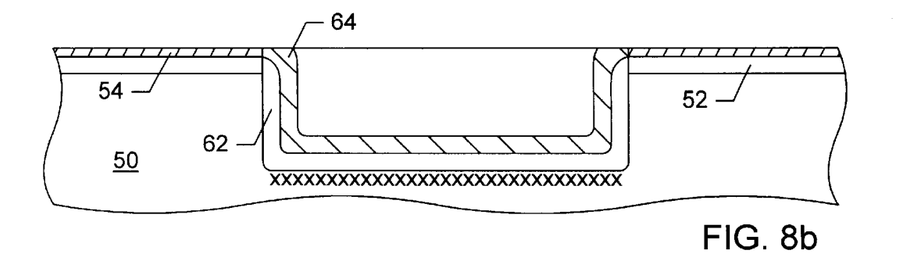
FIG. 8b is a partial cross-sectional view of the semiconductor topography, wherein portions of the fill oxide, the layer of dielectric material, and the nitride layer are removed down to a level spaced above the upper surface of the substrate using CMP, subsequent to the step in FIG. 7b.
Figure 9A:
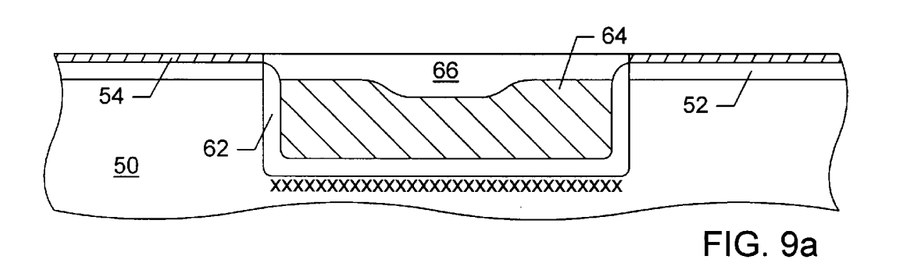
Figure 9B:
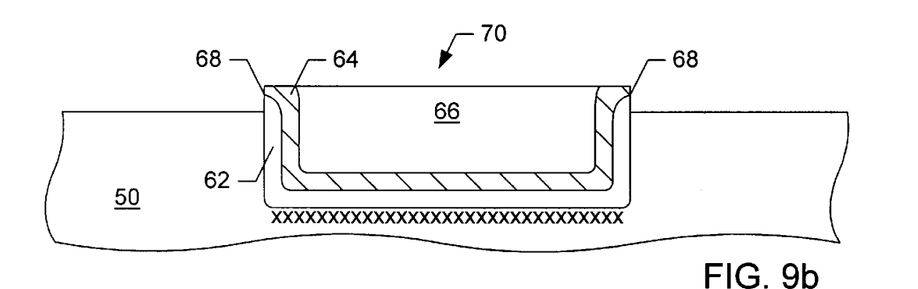
FIG. 9b is a partial cross-sectional view of the semiconductor topography, wherein the oxide layer and the nitride layer are etched from above the semiconductor substrate to form a trench isolation structure, subsequent to the step in FIG. 8b.
Figure 10:
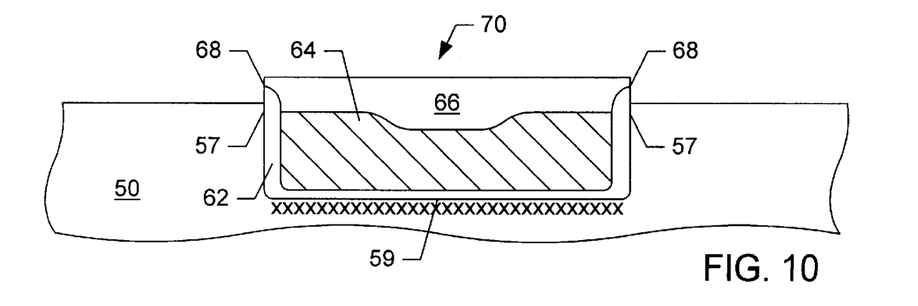

FIG. 7b illustrates a fill oxide 66 being CVD deposited upon the layer of dielectric material 64 to a level spaced above the upper surface of masking layer 54, subsequent to the step depicted in FIG. 6b. As shown in FIG. 8a, a fill oxide 66 may similarly be deposited across the upper surface of dielectric material 64 to a level spaced above masking layer 54, subsequent to the step depicted in FIG. 7a. As shown in FIGS. 8b and 9a, CMP may be used to simultaneously planarize the upper surface of the semiconductor topography and remove fill oxide 66, dielectric material 64, and nitride layer 54 down to a level spaced above the surface of substrate 50. FIG. 8b depicts the CMP step being performed on the semiconductor topography formed in FIG. 7b while FIG. 9a illustrates the CMP step being performed on the topography formed in FIG. 8a. As depicted in FIGS. 9b and 10, the oxide layer 52 and the remaining portions of nitride layer 54 may be removed from above the surface of substrate 50 using optical lithography and an isotropic etch chemistry which exhibits high selectivity to nitride and oxide.

FIG. 9b depicts the completion of the formation of trench isolation structure 70 subsequent to the step in FIG. 8b. FIG. 10 illustrates the completion of the formation of trench isolation structure 70 after the step in FIG. 9a. The resulting trench isolation structure 70 shown in FIGS. 9b and 10 extends approximately 0.1 to 0.5 microns above the upper surface of substrate 50. The layer of dielectric material 64 shown in FIG. 9b is isolated from substrate 50 by oxide liner 62 and is partially bound between oxide liner 62 and fill oxide 66. Dissimilar from the layer of dielectric material 64 depicted in FIG. 9b, the dielectric material 64 shown in FIG. 10 is completely encapsulated by oxide liner 62 and fill oxide 66. The trench isolation structure 70 illustrated in FIG. 10 contains a larger percentage of low K dielectric material 64 than the trench isolation structure 70 depicted in FIG. 9b. Accordingly, the trench isolation structure 70 shown in FIG. 10 is less likely to experience breakdown than the trench isolation structure 70 shown in FIG. 9b during operation of an ensuing integrated circuit. The presence of the low K dielectric material 64 within both embodiments of the trench isolation structure 70 reduces the possibility of current inadvertently flowing between active areas separated by the isolation structure.

Figure 11A:
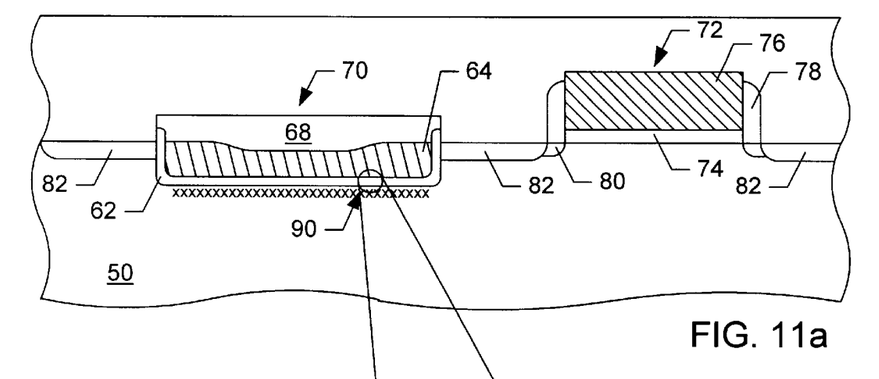
FIG. 11a is a partial cross-sectional view of the semiconductor topography, wherein a transistor is placed laterally adjacent the trench isolation structure formed in FIG. 10.
Figure 11B:
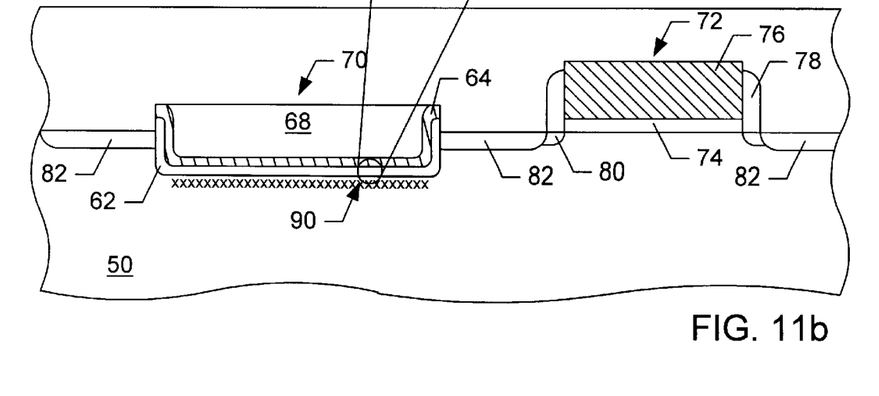
FIG. 11b is a partial cross-sectional view of the semiconductor topography, wherein a transistor is placed laterally adjacent the trench isolation structure formed in FIG. 9b.
Figure 11C:
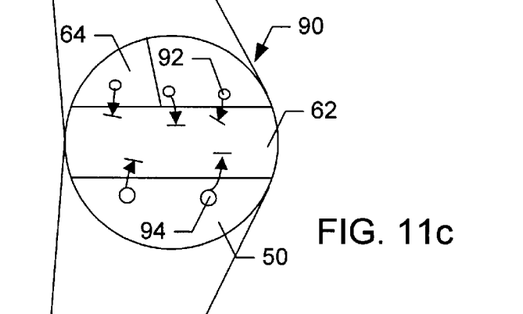
FIG. 11c is a detailed view along section 90 of FIGS. 11a and 11b, wherein the oxide liner inhibits cross-difflusion of atoms between the dielectric material and the semiconductor substrate.

FIG. 11a depicts the semiconductor topography shown in FIG. 10 after active devices, such as transistor 72 have been formed within and upon substrate 50. Likewise, FIG. 11b illustrates the semiconductor topography shown in FIG. 9b after the formation of active devices, such as transistor 72 adjacent to the trench isolation structure 70. The transistor 72 shown in each figure includes a doped polycrystalline silicon gate conductor 76 spaced above substrate 50 by a gate dielectric 74. Dielectric sidewall spacers 78 are arranged upon the opposed sidewall surfaces of gate conductor 76. Lightly doped drain ("LDD") areas 80 which contain a relatively light concentration of dopants are arranged within substrate 50 directly underneath sidewall spacers 78. Heavily doped source/drain regions 82 are arranged laterally adjacent LDD areas 80. Source/drain regions 82 of different active devices are isolated from each other by trench isolation structure 70. FIG. 11c depicts a detailed view along section 90 of both FIGS. 11a and 11b. Section 90 of the two figures is very similar. Oxide liner 62 serves as a diffusion barrier which prevents cross-diffusion of atoms between low K dielectric material 64 and substrate 50. As described previously, dielectric material 64 may comprises atoms 92, such as F, H, and/or C which could contaminate source/drain regions 82. Further, impurities within substrate 50, such as atoms 94 could deleteriously affect the operability of the ensuing integrated circuit if they pass into trench isolation structure 70. Oxide liner 62 thus blocks the migration avenues of atoms 92 and atoms 94 through the oxide liner to other regions of the semiconductor topography.

It will be appreciated to those skilled in the art having the benefit of this disclosure that this invention is believed to provide a method for forming a trench isolation structure which includes a dielectric material having a low dielectric constant spaced from a semiconductor substrate. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a transistor, comprising:
    forming an oxide liner upon sidewall surfaces and a base of an isolation trench arranged within a semiconductor substrate;
    depositing a dielectric material having a dielectric constant less than approximately 3.8 into said trench, and depositing said dielectric material across a masking layer arranged laterally outside a perimeter of the trench;

etching said dielectric material down to a level approximately commensurate with an upper surface of the semiconductor substrate; and forming a fill oxide across said dielectric material such that said oxide liner and said fill oxide substantially encapsulate said dielectric material.

2. The method of claim 1, wherein said masking layer comprises a chemically-vapor deposited silicon nitride layer arranged across a pad oxide layer.

3. The method of claim 1, wherein said forming the fill oxide across said dielectric material comprises:

depositing said fill oxide across exposed surfaces of said dielectric material, said oxide liner, and said masking layer to a level spaced above said masking layer; and chemical mechanical polishing an upper surface of said fill oxide to simultaneously planarize said upper surface and remove said masking layer and said fill oxide down to a level spaced above said semiconductor substrate.

4. The method of claim 3, further comprising etching said masking layer from above said semiconductor substrate while retaining said fill oxide such that opposed lateral edges of said fill oxide are aligned to said sidewall surfaces of said trench.

5. The method of claim 1, wherein said dielectric material comprises a material selected from the group consisting of fluorosilicate glass, hydrogen silsesquioxane, fluorinated polysilicon, poly-phenylquinoxaline, polyquinoline, methysilsequixoxane polymer, and fluoro-polymide.

6. The method of claim 1, further comprising implanting channel-stop dopants into a region of said semiconductor substrate directly underneath said trench subsequent to forming said trench.

7. The method of claim 1, wherein said oxide liner serves as a diffusion barrier against cross-diffusion of atoms of said dielectric material and atoms of said semiconductor substrate.

* * * * *